(12) United States Patent
Thorslund et al.

(10) Patent No.: US 12,110,881 B2
(45) Date of Patent: Oct. 8, 2024

(54) THERMAL CONTROL SYSTEM

(71) Applicant: APR Technologies AB, Enköping (SE)

(72) Inventors: Robert Thorslund, Steningehöjden (SE); Peter Nilsson, Sundbyberg (SE)

(73) Assignee: APR Technologies AB, Enkoping (SE)

( * ) Notice: Subject to any disclaimer, the term of this patent is extended or adjusted under 35 U.S.C. 154(b) by 165 days.

(21) Appl. No.: 17/737,129

(22) Filed: May 5, 2022

(65) Prior Publication Data

US 2022/0268529 A1    Aug. 25, 2022

Related U.S. Application Data

(63) Continuation-in-part of application No. 16/071,476, filed as application No. PCT/SE2017/050059 on Jan. 20, 2017, now Pat. No. 11,708,824.

(30) Foreign Application Priority Data

Jan. 20, 2016   (SE) .................... 1650061-3

(51) Int. Cl.
F04B 19/00        (2006.01)
F04B 17/03        (2006.01)
(Continued)

(52) U.S. Cl.
CPC ............ *F04B 19/006* (2013.01); *F04B 17/03* (2013.01); *F04B 19/00* (2013.01); *F04B 33/00* (2013.01); *F04B 37/10* (2013.01); *F04B 39/06* (2013.01); *F04B 43/043* (2013.01); *F04B 49/06* (2013.01); *F04B 53/00* (2013.01); *F28D 21/00* (2013.01);
(Continued)

(58) Field of Classification Search
CPC ........ F04B 19/006; F04B 19/00; F04B 33/00; F04B 37/10; F04B 39/06; F04B 43/043; F04B 53/00; F04B 17/03; F04B 49/06; F28F 13/16; H01J 41/18; H01L 23/467;
(Continued)

(56) References Cited

U.S. PATENT DOCUMENTS 3,400,882 A    9/1968  McManus
5,180,288 A    1/1993  Richter
(Continued)

FOREIGN PATENT DOCUMENTS

DE    202014000176    2/2014
EP       1901352      3/2008
(Continued)

OTHER PUBLICATIONS

U.S. Appl. No. 16/071,476, filed Jul. 19, 2018, Thorslund et al.
Office Action dated Jan. 28, 2022 for U.S. Appl. No. 16/071,476, 13 pages.
Final Office Action dated Aug. 9, 2022 for U.S. Appl. No. 16/071,476, 13 pages.

*Primary Examiner* — Peter J Bertheaud
(74) *Attorney, Agent, or Firm* — NIXON & VANDERHYE P.C.

(57) ABSTRACT

A thermal control system includes a closed loop arranged to carry a circulating fluid. There is at least a first heat exchanger and a flow unit in the closed loop. The flow unit includes a first electrode and a second electrode offset from the first electrode in a downstream direction of a flow of the circulating fluid. The first electrode and the second electrode are connectable to a voltage source. The first electrode is formed as a grid structure and arranged to allow the circulating fluid to flow through the first electrode.

13 Claims, 9 Drawing Sheets

(51) Int. Cl.
| | |
|---|---|
| *F04B 33/00* | (2006.01) |
| *F04B 37/10* | (2006.01) |
| *F04B 39/06* | (2006.01) |
| *F04B 43/04* | (2006.01) |
| *F04B 49/06* | (2006.01) |
| *F04B 53/00* | (2006.01) |
| *F28D 21/00* | (2006.01) |
| *F28F 13/16* | (2006.01) |
| *H01J 41/18* | (2006.01) |
| *H01L 23/467* | (2006.01) |
| *H02K 44/00* | (2006.01) |
| *H02K 44/02* | (2006.01) |

(52) U.S. Cl.
CPC .............. *F28F 13/16* (2013.01); *H01J 41/18* (2013.01); *H01L 23/467* (2013.01); *H02K 44/00* (2013.01); *H02K 44/02* (2013.01); *F28D 2021/0021* (2013.01); *F28F 2250/08* (2013.01); *H01L 2924/00* (2013.01); *H01L 2924/0002* (2013.01)

(58) Field of Classification Search
CPC ........ H01L 2924/00; H01L 2924/0002; H02K 44/00; H02K 44/02
See application file for complete search history.

(56) References Cited

U.S. PATENT DOCUMENTS

| | | |
|---|---|---|
| 7,494,326 B2 | 2/2009 | Bonne |
| 2004/0234378 A1* | 11/2004 | Lovette ............... F28D 15/0266 |
| | | 257/E23.098 |
| 2009/0321056 A1 | 12/2009 | Ran et al. |
| 2010/0177519 A1 | 7/2010 | Deschenaux et al. |
| 2010/0177549 A1 | 7/2010 | Schlitz |
| 2011/0097215 A1 | 4/2011 | O'Shaughnessy |
| 2011/0116206 A1 | 5/2011 | Kim |
| 2011/0139408 A1 | 6/2011 | Jewell-Larsen et al. |
| 2011/0157813 A1 | 6/2011 | Macdonald |
| 2012/0002342 A1 | 1/2012 | Lee et al. |
| 2015/0144608 A1 | 4/2015 | Sin-Wei et al. |

FOREIGN PATENT DOCUMENTS

| | | | |
|---|---|---|---|
| JP | 2010-063342 | | 3/2010 |
| JP | 2011-135074 | | 7/2011 |
| JP | 2014-212625 | | 11/2014 |
| SE | 1550716 | | 12/2016 |
| WO | 2009/094441 | | 7/2009 |
| WO | 2011/058411 | | 5/2011 |
| WO | WO2015084238 | * | 6/2015 |
| WO | 2016/195570 | | 12/2016 |

* cited by examiner

THERMAL CONTROL SYSTEM

CROSS-REFERENCES TO RELATED APPLICATIONS

This application is a continuation-in-part of U.S. application Ser. No. 16/071,476 filed Jul. 19, 2018, now U.S. Pat. No. 11,708,824, which is the U.S. national phase of PCT/SE2017/050059 filed Jan. 20, 2017 which designated the U.S. and claims priority to SE Application No. 1650061-3 filed Jan. 20, 2016, the entire contents of each of which are hereby incorporated by reference.

BACKGROUND

The technology disclosed herein relates to devices for circulating fluids. More precisely, it relates to a closed loop system wherein the flow of a circulating fluid, such as e.g., a thermal management liquid, may be regulated by means of a flow unit.

The performance of electronic systems is to a large extent limited by the available thermal management techniques for keeping the electronics within an appropriate temperature range. Smaller electronic devices having improved performance are associated with increased heat dissipation over a relatively small area. In other words, there is a growing need for space and energy efficient thermal management of electronic devices.

As an example, satellites, such as telecommunication satellites, are approaching the technology limits of existing on-board thermal management systems. The power dissipation needs of these satellites increases to meet the growing requirements for broadcasting, broadband multimedia and mobile communications services. Micro, nano, or 'cube' satellites, which require low-mass heat removal from electronic components (satellite on-chip), are likely to need more compact thermal management systems for maintaining a high performance.

Active cooling systems using forced flows of fluids can be used to improve the cooling efficiency. One example of such active cooling systems includes electrohydrodynamical (EHD) pumps where ionized particles or molecules interact with an electric field and entrain a flow of a thermal management medium.

Even though such EHD pumps may be employed in various thermal management applications, there is still a need for an improved device and method for controlling the flow of a fluid and for providing improved thermal management.

SUMMARY

It is an object of at least some of the embodiments to provide a device allowing for an improved control the flow of a thermal management fluid. It is a particular object to improve the control of a circulating fluid in a fluidic device. An additional object is to provide thermal management systems that can be tailored to meet specific needs for thermal management.

Accordingly, example embodiments are described that achieve these and other objectives.

In a first aspect, a fluidic device is provided. The fluidic device comprises an enclosed passage that is adapted to convey a circulating fluid. The enclosed passage may, e.g., define a closed loop in which the fluid may circulate. Further, a flow unit is arranged in the enclosed passage. The flow unit comprises a first electrode and a second electrode, wherein the second electrode is offset from the first electrode in a downstream direction of a flow of the circulating fluid. The first electrode and the second electrode are connectable to a voltage source. According to the first aspect, the first electrode is formed as a grid structure allowing the circulating fluid to flow through the first electrode.

In a second aspect, a method in a fluidic device according to the first aspect is provided. The method comprises the steps of activating the flow unit so as to induce a flow of the fluid in the fluidic device, and deactivating the fluidic device so as to impede a flow of the fluid in the fluidic device.

The fluidic device may be used for controlling or regulating the flow of the fluid circulating in the enclosed passage. In other words, the flow unit may act or operate as a valve opening, reducing, or even closing the passage.

By activating the flow unit, i.e., applying a voltage difference between the electrodes of the flow unit, the fluid may be brought to flow or circulate in the enclosed passage to provide a path having a relatively high heat flow (or low thermal resistance) between two points or portions of the fluidic device, and in particular the enclosed passage. The circulating fluid may be utilized for heat transport for heating or cooling purposes. The heat may, e.g., be transported away from a heat generating application such as, e.g., an electronic circuit or device, and dissipated to the surroundings or transferred to a heat sink in thermal contact with the enclosed passage. In a satellite embodiment, non-limiting examples of heat sinks may include a radiator, a heat pipe or any type of mechanical structure.

By deactivating, or turning off the flow unit, the fluidic device may be put in an operational mode wherein the flow through the flow unit may be reduced or eliminated. This may, e.g., be achieved by reducing or removing the voltage difference between the electrodes, or applying a voltage difference counteracting a flow through the flow unit. By reducing or eliminating the flow through the flow unit, the circulation of the fluid in the enclosed passage or loop may be reduced or even stopped. This may provide a path having a relatively low heat flow (or high thermal resistance) between two points of the fluidic device, and in particular the enclosed passage. This is of particular interest in, e.g., space applications wherein the cooling system can be 'turned off' when parts of the system, such as the heat dissipating parts or heat sink, face, e.g., the sun or the cold space. By reducing or stopping the circulation of the fluid, the heat entering the system from the surroundings may be prevented from reaching the parts of the system that need to be thermally managed or protected from overheating or from getting to cool.

Thus, a closed system is provided that can be utilized in, e.g., thermal management applications requiring improved thermal management. The fluidic device may be of particular interest in, e.g., space applications, where harsh environmental conditions and limited or non-existent possibilities for service and maintenance requires efficient and reliable solutions as well as solutions that can regulate the heat transporting capabilities of the thermal management system.

It is understood that the term 'grid' refers to any structure comprising bridges that are joined to each other, such as to, e.g., a grating, net, or honeycomb structure, etc. The bridges and the joints define open areas of the grid which admit a fluid flow.

The terms 'direction of flow' or 'flow direction' should be understood as the main direction of the resulting net flow of gaseous fluid passing through the device during operation. These terms may also be referred to as 'intended direction of flow'.

The term 'passage' should be understood as any duct, vessel, chamber, or channel suitable for conveying a flow of a fluid. The fluid may, e.g., circulate in a passage forming a closed loop, and/or in a chamber allowing the fluid to circulate within the chamber.

Examples of fluids, i.e., liquids and gases, that can be pumped by example embodiments include e.g., dielectrics such as acetone, alcohols, helium, nitrogen, and fluorocarbon-based fluids such as e.g., Fluorinert™ or Novec™.

The first electrode may also be referred to an "emitter" or "emitter electrode", and the second electrode may be referred to as "collector" or "collector electrode". During use, the emitter may be adapted to emit electrons into the fluid and/or to negatively charge matter, such as particles or impurities of the fluid, in a close proximity of the emitter.

The first and/or second electrodes may comprise a material that has a relatively good ability of emitting electrons and is chemically stable, or inert, in relation to the pumped fluid. Further, the material may have a relatively high temperature resistance. Examples of such materials may include, e.g., Pt, Au, and stainless steel.

According to an example embodiment, the first electrode may comprise bridges and joints forming the grid structure. Further, at least a portion of at least one of the bridges may have a maximum height in a direction parallel to the direction of the flow and a maximum gauge in a direction orthogonal to the direction of the flow, where the maximum height may be larger than the maximum gauge.

By forming a grid of bridges that have a relatively large height in relation to their gauge, the grid may be relatively rigid in terms of its ability to carry loads in the height direction of the bridges, or the direction of the flow. Thereby, a relatively rigid electrode is provided, which is less prone to bend or deform, especially in the direction of the flow, and hence the risk for, e.g., short-circuiting of the device may be reduced. Further, the relatively rigid and stable grid may still have a relatively large open area which may provide a relatively low flow resistance being met by the fluid passing through the grid. Further, the relatively high and narrow bridges may reduce the amount of material required for forming a relatively stable and rigid grid, which may reduce both weight and cost of the device. By using a relatively rigid grid, the need for additional support structures may be reduced and a relatively well defined and constant spacing between the first and second electrodes may be achieved. The spacing may, e.g., be within the range of 10-2000 µm, and more preferably in the range of 50-1000 µm.

With their relatively large height, the bridges also provide a relatively large contact surface between the grid structure and the passing fluid, which may facilitate any interactions between the electrode and the fluid, such as, e.g., diffusion of material and/or injection of ions or electrons.

The distance, or spacing, between the first and the second electrode may be varied so as to control the strength of the electric field being induced between the electrodes. Experiments have shown that a smaller gap, and thus a stronger induced electric field, may enable increased pump efficiency, or flow rate, as compared to devices having a larger gap and being supplied with the same electric power.

According to some example embodiments, the flow unit may be arranged to cover at least part of a cross section of the enclosed passage. Preferably, the flow unit may be arranged to cover an entire cross section of the enclosed passage. A flow unit not covering the entire cross section of the passage may allow for a leak flow, i.e., a flow of fluid passing at the side of the flow unit rather than through it. Consequently, a flow unit covering the entire cross section of the passage may prevent any such leak flow. Further, a larger coverage of the flow unit may lead to a fluidic device having an increased pumping and/or blocking efficiency.

Alternatively, or additionally, the flow unit may be arranged in a (preferably single) chamber such that a circulating flow is achieved within the chamber. The flow unit may, e.g., be arranged adjacent to a wall portion of the chamber and oriented such that the fluid passing through the flow unit may induce a circulation of the fluid in the chamber.

According to an example embodiment, the fluidic device may comprise an array of flow units arranged to have a lateral extension in a common lateral plane, wherein a downstream side of a first one of the flow units may be in fluid communication with an upstream side of a second one of the flow units so as to allow the circulating fluid to pass through said first and second one of the flow units.

By arranging the flow units in an array extending in a lateral plane, a relatively flat and/or thin flow unit may be achieved that may be advantageous over flow units comprising several, stacked stages. Arranging a plurality of flow units abreast instead of above each other in a stack allows for the total height to be reduced, thereby allowing for a flow unit or array that can be used in applications wherein space is limited. Further, a thinner and/or flatter pump may have a larger surface-to-volume ratio, which may facilitate cooling or dissipation through an outer surface of the array.

Connecting a downstream side of a first flow unit with an upstream side of a second or neighboring flow unit allows for the fluid to be pumped or accelerated in several steps, which may increase, e.g., pumping efficiency, flow velocity, and volumetric flow rate of the array. This arrangement may be similar to an array of series connected or cascade connected flow units for enhancing, controlling or manipulating a flow of the fluid. Pressure, volumetric flow or velocity of the fluid flow may be increased at each, or at least some of, the flow units in the array.

The flow units of the array may be oriented in the same direction, i.e., such that the downstream side of each flow unit, respectively, faces in a same direction. In other words, the flow units may be arranged abreast such that the direction of fluid flow is parallel for each flow unit. Such orientation may facilitate manufacturing and assembling of the array. Arranging all flow units in a same orientation, e.g., with the upstream side facing a first direction and the downstream side facing a second, possibly opposing, direction may also facilitate electrical connection of the flow units. In one example, this allows for all first electrodes to be electrically connected on a first side of the array and/or the second electrodes to be electrically connected on a second side of the array.

Alternatively, the array may comprise at least one flow unit pointing, or being oriented, in an opposite direction as compared to the other flow units of the array. This may facilitate or simplify the fluid communication between two oppositely arranged flow units, since the fluid flow may exit the first one of the flow units and enter the second one of the flow units at the same side of the array. Shifting or alternating the orientation of one or several of the fluid units may further reduce the size of the array, thereby allowing for a smaller and yet relatively efficient array.

According to an example embodiment, at least a portion of the enclosed passage may be adapted to be thermally connected to a heat transferring means so as to allow transfer of heat between the circulating fluid and a surrounding of the fluidic device.

According to some example embodiments, the enclosed passage may be adapted to be thermally connected to, and/or in fluid connection with, a heat exchanger. The heat exchanger may, e.g., be a heat sink or cold plate, or a heat source or hot plate.

According to an example embodiment, the enclosed passage may be formed of a first chamber in fluid communication with a second chamber. Further, the flow unit may be arranged in one of the first chamber and the second chamber.

According to an example embodiment, at least a portion of the enclosed passage may be formed as a tube.

According to an example embodiment, the second electrode may be formed as a grid structure that allows the fluid to flow through the second electrode. At least one of the bridges may comprise a portion having a maximum height in a direction parallel to the direction of the flow and a maximum gauge in a direction orthogonal to the direction of the flow, wherein the maximum height may be larger than the maximum gauge, preferably at least twice the maximum gauge. This example embodiment is associated with similar advantages and effects as described with reference to the structure of the grid of the first electrode.

Alternatively, or additionally, the first and/or second electrode may be formed as, or comprise, a rod having a height or length corresponding to the maximum height and width, or thickness, corresponding to the maximum width. The rod may, e.g., be formed as a cylinder, pillar or needle, and may be hollow, solid, or porous. In one example, the rod may be adapted to let a flow of gaseous fluid pass through its interior. Furthermore, the rod may have a tapered or pointed end portion, preferably in a direction of the fluid flow. In a further example, the first and/or second electrode may be formed of or comprise a plurality of rods, which, e.g., may be arranged such to have a length extension essentially parallel to the fluid flow, and/or arranged in a two-dimensional or three-dimensional array. Using a plurality of rods, and hence a plurality of emitting points, is advantageous in that is may increase the redundancy of the emitter.

According to an embodiment, at least one of the first electrode and the second electrode may comprise a suspension structure. The suspension structure may, advantageously, be arranged to absorb thermally induced deformations in the first electrode or the second electrode, respectively. The suspension structure may thus be used to mitigate or compensate for thermally induced stresses, particularly in a plane orthogonal to the direction of the fluid flow and/or in a main length direction of at least a portion of the first or second electrodes. The deformation structure may, e.g., be formed by a bridge being curved in the plane orthogonal to the direction of the flow. As the bridge is exposed to stresses or torsional torques in the plane orthogonal to its height (i.e., the flow direction), the bridge may due to its relatively large height and small gauge tend to deform in that plane rather than in the flow or height direction. Alternatively, the suspension structure may be adapted to apply a tensile stress to the electrode such that it may maintain its shape in a main length direction during thermal expansion. The deformation (or suspension) structure advantageously allows for a device being less sensitive to thermally induced stresses and thermal expansion. Thereby a device having relatively well-defined dimensions and a relatively reliable shape may be achieved. Furthermore, the deformation structure may allow materials having different coefficients of thermal expansion (CTE) to be combined. As an example, the first and/or the second electrodes may be formed of a material having a first CTE whereas the support structure, to which the first and/or the second electrodes may be attached, may have another CTE. In such case, a deformation structure may be provided in the electrodes and/or the support structure so as to enable any internal thermal stresses that may be caused by the difference in CTE to be absorbed by the deformation structure being deformed in the plane orthogonal to the direction of the fluid flow. Thus, the deformation structure may enable a more reliable device having a prolonged life.

It will be appreciated that the first electrode and/or the second electrode and/or the support structure may be formed of a material that is selectively deposited so as to form the desired structure. The material may, e.g., comprise a stacked structure of one or several metals. The depositing method may, e.g., comprise molding, plating, screen printing, glazing, sputtering, evaporation or sintering. Alternatively, or additionally, the manufacturing may comprise removal of material, e.g., by selectively removing material from a substrate. Examples of suitable techniques may include cutting, milling, etching, and abrasive blasting.

The first and/or second electrodes may advantageously comprise a material that has a relatively good ability of emitting electrons and is chemically stable, or inert, in relation to the pumped fluid. Further, the material may have a relatively high temperature resistance. Examples of such materials may include, e.g., Pt, Au, Ni, W, Zr and stainless steel.

In the present specification, the term 'flow unit' or 'pump' or 'pump unit' interchangeably used.

As outlined above, the method in the fluidic device may be embodied as computer-executable instructions distributed and used in the form of a computer-program product including a non-transitory, computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media (or non-transitory media) includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media (or transitory media) typically embodies computer readable instructions, data structures, program modules or other data in a modulated data signal such as a carrier wave or other transport mechanism and includes any information delivery media.

Further objectives of, features of and advantages will become apparent when studying the following detailed disclosure, the drawings, and the appended claims. Those skilled in the art realize that different features can be combined into embodiments other than those described in the following.

BRIEF DESCRIPTION OF THE DRAWINGS

The above, as well as additional objects, features and advantages will be better understood through the following illustrative and non-limiting detailed description of example embodiments. Reference will be made to the appended drawings, on which.

All the figures are schematic, generally not to scale, and generally only show parts which are necessary for the description, whereas other parts may be omitted or merely suggested.

DETAILED DESCRIPTION OF EXAMPLE NON-LIMITING EMBODIMENTS

Figure 1:
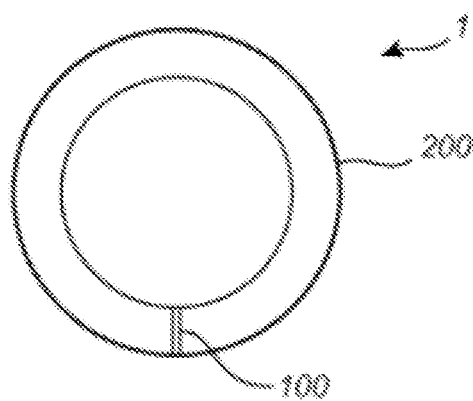
FIG. 1 schematically illustrates a fluidic device comprising an enclosed passage and a flow unit according to an example embodiment.

FIG. 1 shows a fluidic device 1 comprising an enclosed passage 200, e.g., forming a loop, and a flow unit 100. The enclosed passage 200 may, e.g., be formed as a tube or channel wherein the end is connected to the beginning so as to allow for a continuous and repeated flow of a circulating fluid in a closed loop system. The flow unit 100 may be arranged to cover an entire cross section of the enclosed passage 200, as indicated in FIG. 1, or to cover only a part of the cross section so as to allow fluid to pass at the side of the flow unit 100. By arranging the flow unit 100 to cover the entire cross section of the passage 200, all fluid has to pass through the flow unit 100 in order to circulate. This allows for an improved control of the flow.

The fluidic device 1 may be operated in at least two different states: an activated state, and a deactivated or off-state. In the activated state, the flow unit 100 may be operated by means of a potential difference inducing a flow through the flow unit 100 and hence a circulating flow in the enclosed passage 100. In the off-state, the flow 100 may be operated at a zero potential difference, or at a potential difference resulting in a reduced or zero net flow of fluid through the flow unit 100, so as to impede or even stop the circulation of the fluid in the enclosed passage. The flow unit 100 may hence be operated as a control valve regulating the flow in the enclosed passage.

Figures 2A, 2B:
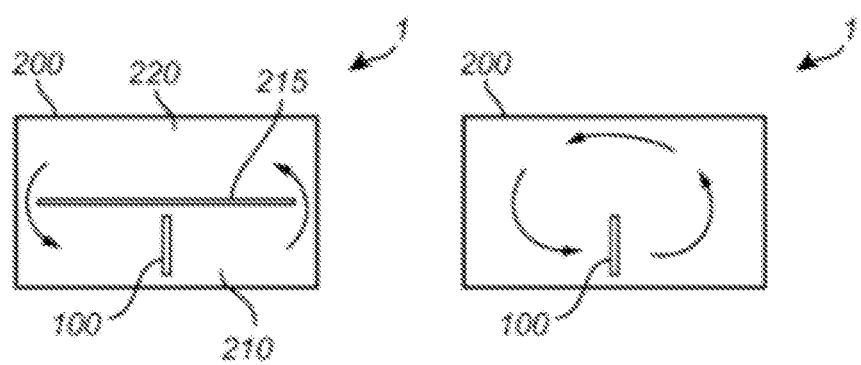
FIGS. 2a and 2b are schematic cross sections of a fluidic device according to some example embodiments.

FIGS. 2a and 2b show a fluidic device 1 according to example embodiments that may be similarly configured as the example embodiment discussed in connection with FIG. 1. According to the embodiment depicted in FIG. 2a, the enclosed passage may be defined by a first chamber 210 and a second chamber 220 that are separated by a dividing wall 215 or septum. The dividing wall 215 may comprise gaps or local passages connecting the first chamber 210 and the second chamber 220 with each other, thereby defining a closed loop in which the fluid may circulate. The fluid may circulate through the first chamber 210, enter the second chamber 220 via one of the gaps in the dividing wall 215, passing through the second chamber 220 and enter the first chamber via the second one of the gaps in the wall 220 (the circulating fluid is indicated by arrows in FIG. 2a).

At least one of the chambers, such as e.g., the first chamber 210 may comprise a flow unit 100 as previously described. The flow unit 100 may be configured to induce a flow in the fluid when operated in the activated state, and to impede or reduce a flow in the fluid when operated in a deactivated state or at a reduced voltage difference as compared to the activated state. Thus, the flow unit 100 may be used for affecting or controlling the circulation of the fluid between the first chamber 210 and the second chamber 220.

Alternatively, or additionally, the enclosed passage 200 may form a single chamber as shown in FIG. 2b. In such case, the flow may circulate within the chamber defined by the enclosed passage, as indicated by the arrows. The flow unit 100 may be arranged to induce the flow, preferably at a position relatively close or adjacent to a wall portion of the chamber. From such position, the flow unit 100 may induce a motion or flow of the fluid in a direction along the wall portion, thereby causing the fluid to circulate accordingly. Additional chambers can be provided in the circulating flow. For example, three or more chambers can be used to define the closed passage that constitutes a closed loop.

Figure 3A:
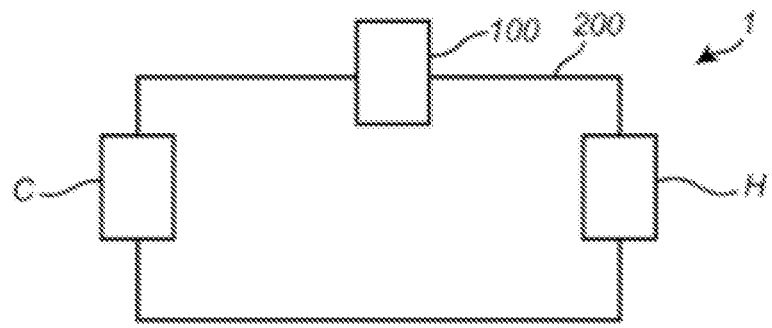
FIG. 3 is a schematic diagram of a fluidic device according to an example embodiment, where the enclosed passage is thermally connected to heat exchangers.

FIG. 3a is a schematic representation of a system or fluidic device according to an example embodiment that may be similarly configured as any one of the previously described embodiments. In FIG. 3a, the enclosed passage is represented by line 200 and the flow unit by the box 100. The enclosed passage may be connected to one or several heat exchangers C, H allowing heat to be added or removed from the fluid. The connection may, e.g., be thermal and/or fluidic, and the heat transfer elements C, H may, e.g., comprise a heat sink C and/or a heat source H.

Figure 3B:
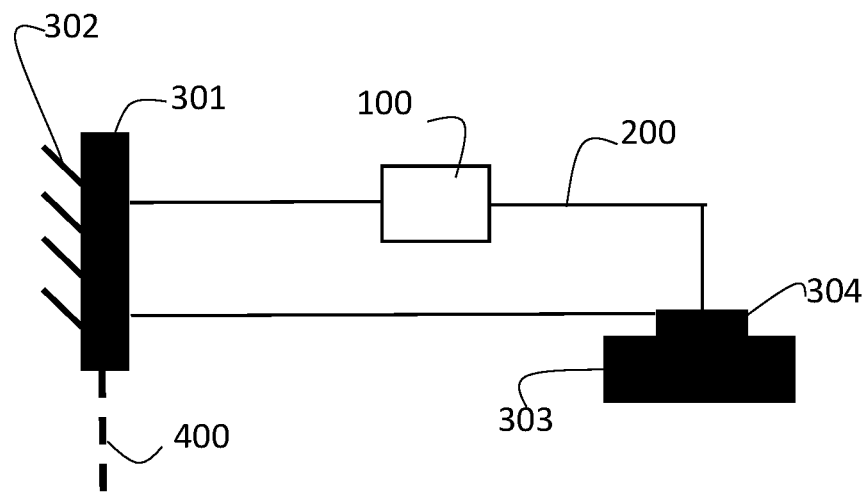

The system as depicted in FIG. 3a can be configured to suit different applications. FIG. 3b shows a first example embodiment where a heat sink 301 is provided to enable heat dissipation from the circulating fluid in the enclosed passage. The heat sink 301 can be provided with flanges 302 to improve thermal exchange via the heat sink 301. The fluid circulating in the enclosed passage 200 circulates via the flow unit 100. The circulating fluid exchanges heat with a device 303. The device 303 can for example be an integrated circuit, IC circuit, or a Printed Circuit Board, PCB. The device 303 can typically have a thermally controlled component 304. The component 304 can for example be a heat generating component or another component requiring thermal control such as a high-resolution camera. The temperature of the component 304 can be controlled by the flow unit 100 to control the thermal exchange in the circulating system.

The flow unit 100 can be arranged in conjunction with another structure such as the heat sink 301. Further, the heat sink 301 can be designed to contact or even form part of a larger structure. The heat sink 301 can for example be part of an outer structure such as a casing/housing of some apparatus. In the example embodiment of FIG. 3b, the outer structure is represented by the vertical dashed line 400. The outer structure can for example be the housing of a satellite or the casing/outside of some other device such as a spacecraft, an air plane or a rover or similar devices.

In another example embodiment, the housing of the flow unit 100 can be in direct contact with the heat sink 301. For example, in the embodiment shown in FIG. 3c, the housing of the flow unit is arranged in direct contact with the heat sink 301 to improve the efficiency of the thermal control.

Figure 3C:
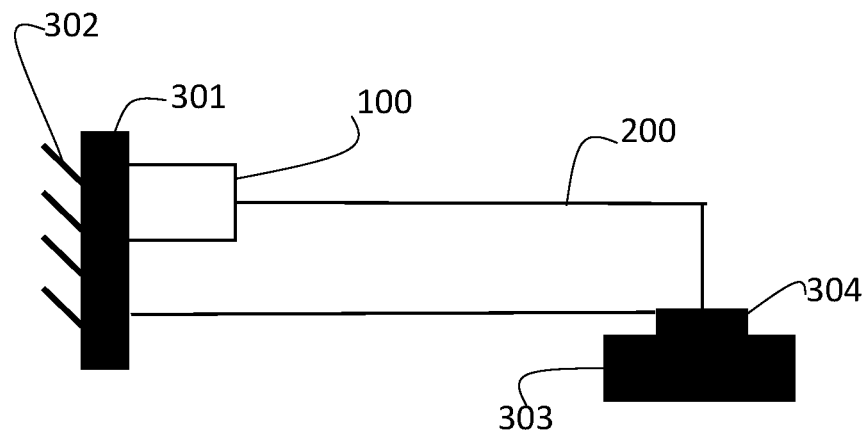
Figure 3D:
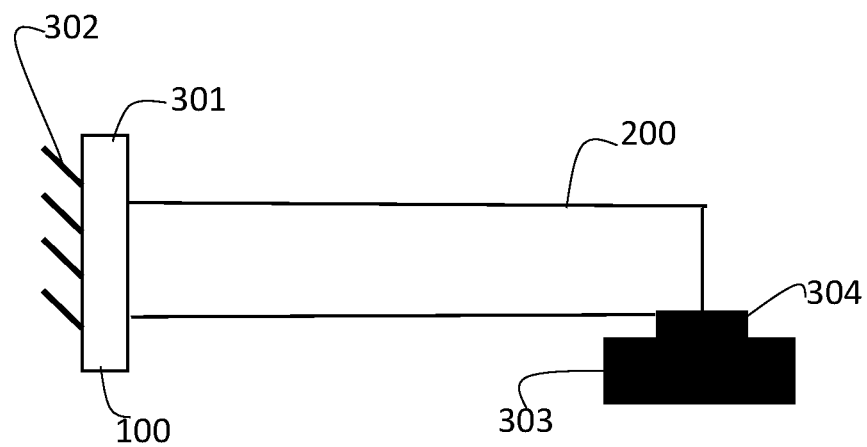

In yet another example embodiment, the housing of the flow unit 100 can be arranged to form at least a part of the heat sink 301 as shown in FIG. 3d. In some example embodiments, the housing of the flow unit 100 can constitute the entire heat sink 301 to improve efficiency.

In the example embodiments of FIGS. 3b-3d, thermal energy is assumed to be transferred from the thermally-controlled component 304 to the heat sink 301. The system can also be used to transfer thermal energy in the opposite direction such that the thermally-controlled component 304 is heated.

Figure 3E:
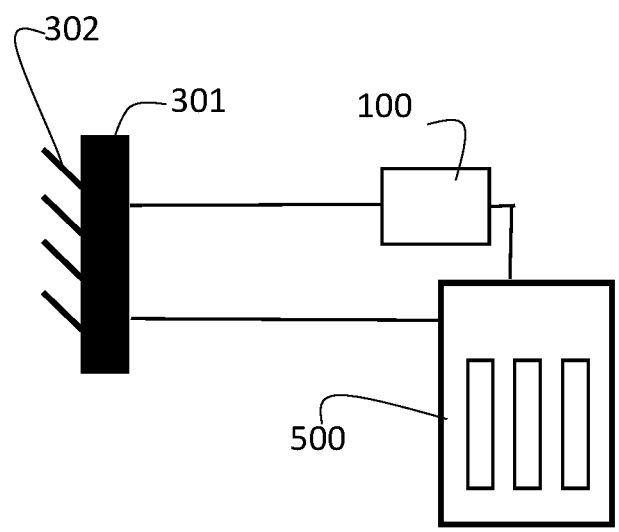

FIG. 3e shows yet another example embodiment of a thermal control system where a battery 500 is thermally-controlled using the flow unit 100.

Figure 3F:
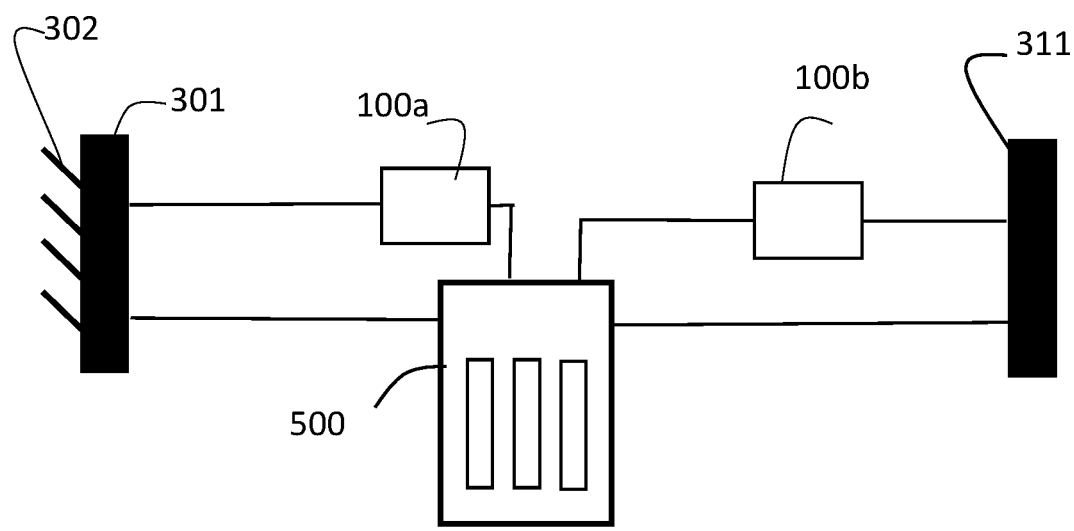

Multiple flow units 100 may be used to further enhance the thermal control. In FIG. 3f, a system using two flow units 100a and 100b is depicted. For example, a first flow unit 100a can be provided in a circulating flow via a heat sink 301. Also, a second flow unit 100b can be provided in a circulating flow via a heat source 311. In such an example embodiment, a thermally-controlled component, in this example a battery 500, can be both heated and cooled depending on the operating conditions. For example, when the thermally-controlled component is a battery 500 having a temperature below an optimal temperature, the battery 500 can be heated by providing a flow by opening the second flow unit 100b and closing the flow via the first flow unit 100a. When the battery 500 becomes warm and has a temperature above some optimal temperature, the battery 500 can be cooled by providing a flow by opening the first flow unit 100a and closing the flow via the second flow unit 100b. In this way, the temperature in the thermally-controlled component, here the battery 500, can be controlled such that the operational temperature of the thermally-controlled component is controlled towards an optimal or other predetermined operational temperature.

The thermal control system as described can also be used in other applications where good thermal control is desired. For example, heat can be transferred from an active antenna to control the temperature of the active antenna. In active antennas, heat often has to be transferred from the antenna to a heat exchanger or to the ambient air. The liquid cooling as described herein can be used to efficiently move heat from the active antenna in order to improve cooling of the active antenna.

In another example embodiment, heat from a radioisotope thermoelectric generator (RTG) can be controlled by the flow unit 100.

In yet other example embodiments, additional flow units and or heat exchangers such as heat sinks, can be provided for improved thermal control of the thermally-controlled component. Also, additional thermally-controlled components can be provided in the system and thermally controlled by one or multiple flow units 100. For example, at least one flow unit 100 can be provided for each thermally controlled component to provide individual thermal control for each thermally-controlled component.

In order to transfer heat to/from a thermally-controlled component, a suitable heat transfer arrangement can be utilized such that heat is transferred between the circulated fluid and the thermally-controlled component. For example, direct contact or a conductive (e.g., metal) connection can be used. A metal connection, for example, can be a solid metal connection or a metal braid connection or similar. Also, other heat transfer methods can be used such as a heat pipe or similar.

Figure 4:
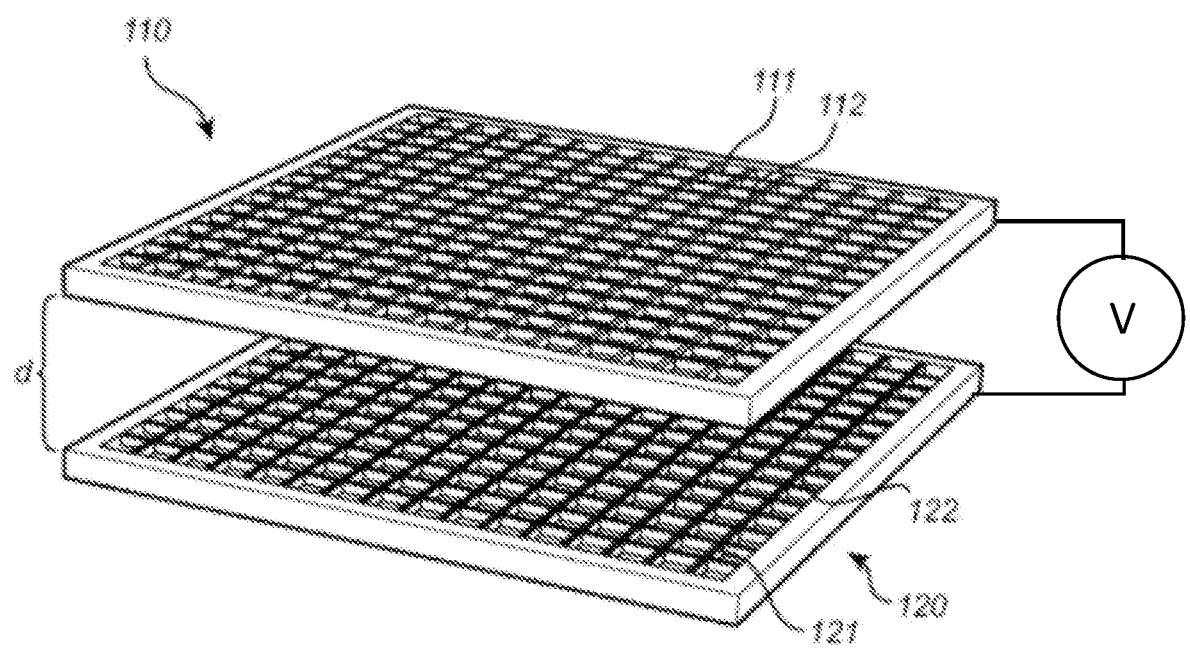
FIG. 4 is a schematic perspective view of a first and second electrode of a flow unit according to an example embodiment.

FIG. 4 shows an example of a flow unit 100 of a fluidic device according to example embodiments similar to the example embodiments of FIGS. 1 to 3. The flow unit 100 may comprise a first electrode, or emitter 110, comprising bridges 111 and joints 112 forming a grid that allows a fluid to flow through the emitter 110. The emitter 110 may have a lateral extension in a plane perpendicular to the intended flow direction flow through the grid of the emitter 110. According to this example embodiment, the second electrode, or collector 120, comprises bridges 121 and joints 122 that are arranged in a similar grid the one described with reference to the emitter 110. Consequently, the collector 120 may have a lateral extension in a plane perpendicular to the direction of the flow such that both the emitter 110 and the collector 120 are parallel to each other. Thus, there can be a first electrode; and a second electrode offset from the first electrode in a downstream direction of a flow of the circulating fluid, and the first electrode and the second electrode can be connectable to a voltage source V.

Although not illustrated in FIG. 4, it will be appreciated that the second electrode 120 may be provided in other shapes and/or configurations than a grid. The second electrode 120 may e.g., be formed as, or comprise, one or several wires (which may have a main direction of extension in a plane essentially parallel with the first electrode 110) or pillars, needles, cylinders or rods that may be oriented, e.g., along the direction of the flow. In accordance with some example embodiments, additional electrodes (not shown) can be provided. For example, the first electrode can be formed by a plurality of electrodes and or the second electrode can be formed by a plurality of electrodes. In accordance with some example embodiments multiple pairs of electrodes as provided in a closed loop circulating a fluid. In such example embodiments, multiple flow units 100 can be provided.

As indicated in the present figure, the emitter 110 and the collector 120 may be arranged spaced apart from each other in the flow direction by a positive distance d. The spacing may, e.g., be maintained by a support arrangement, or grid spacer 130 (not shown in FIG. 4) being arranged between the emitter 110 and the collector 120. A relatively narrow gap d may be desirable since such gap may provide a relatively high electric field and thus enhance the electro-hydrodynamic effect affecting the flow rate. The use of a grid spacer 130, which may have a well-defined thickness, may advantageously reduce the risk of a shortcut or breakdown between the emitter 110 and the collector 120. As will be discussed in more detail below, the grid spacer 130 may e.g., have a similar configuration as the emitter 110 and/or the collector 120, i.e., comprising a grid of bridges 111, 121 and joints 112, 122. The grid spacer 130 may however have other configurations as well, such as, e.g., being formed as a frame supporting the lateral edges of the emitter 110 and/or collector 120.

It will also be realized that the grid may have one of a broad variety of shapes, wherein the edges and the joints, e.g., may form a grating, a net, a hole pattern, a honeycomb structure, or other structures or patterns suitable for admitting a flow through the emitter 110 and/or collector 120.

FIGS. 5a-5d show cross sections of a portion of the emitter 110 and collector 120 of a flow unit similarly configured as the flow units described with reference to any of the previous figures. The cross section is taken through three pairs of the bridges 111, 121 and along a plane parallel to the flow direction. According to this example embodiment, the bridges 111 of the emitter 110 are arranged at a constant distance d from the bridges 121 of the collector 120, where the bridges 111 of the emitter have a maximum height h1 in the flow direction and a maximum gauge w1 in a direction orthogonal to the flow direction. The maximum height h1 is greater than the maximum gauge w1 so as to enable a relatively stable and rigid grid structure that can carry a relatively large load in the flow direction without a risk of deforming or collapsing, and yet have a relatively large open area allowing the fluid flow. For example, the grid structure may be made rigid enough to carry a predetermined load in the flow direction without a risk of deforming or collapsing, and the grid structure may be given a large open area allowing the fluid flow. The open area can be optimized while still maintaining the desired capacity to carry a predetermined load. According to this example embodiment, the collector 120 may be formed of a grid having a similar relationship between the maximum height h2 and the maximum gauge w2 of the bridges 121. The ratio between the maximum height h1, h2 and the maximum gauge w1, w2 may, e.g., be larger than 1, and more preferably larger than 2.

The cross section of the bridges 111 of the emitter 110 may comprise a downstream portion 113 having a tapered shape forming an edge or a point 114 facing the collector 120. The tapered shape may, e.g., be manifested as an edge or narrow end 114 extending along the downstream portion 113 of the bridge 111, or one or several protrusions having a shape conforming to, e.g., a tip, needle, pyramid, dome, etc. As the emitter 110 is subjected to an electric potential difference, there may be an electric field concentration at the edge 114 of the tapered portion 113 which may facilitate or promote emission of electrons.

Correspondingly, the portion of the bridges 121 of the collector 120 which face the emitter 110 may be provided with a dedicated shape or surface structure for enhancing collection of the emitted electrons. The bridges 121 and/or joints 122 of the collector 120 may, e.g., be provided with a concave surface portion 123 increasing the surface area, and/or a structured surface comprising microscopic protrusions and/or recesses 124 increasing the active surface area. The structures 124 may, e.g., be formed by molding, electroplating, surface treatment, or by selectively adding and/or removing material by, e.g., abrasive blasting, etching, milling, grinding, etc.

Figure 5A:
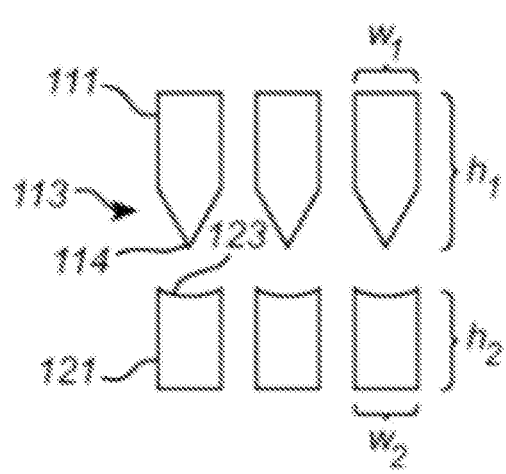
FIGS. 5a-5d show cross sectional portions of the first and second electrode of a flow unit according to an example embodiment.
Figure 5B:
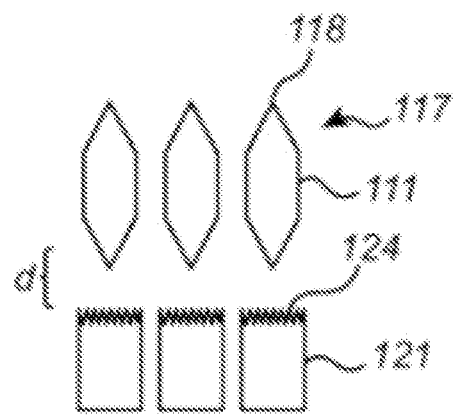

FIG. 5a shows an example embodiment where the emitter 110 and the collector 120 are formed by screen printed Pt paste which has been sintered at about 800° C. so as to form a grid of bridges having a maximum height h1, h2 of about 100-200 μm and a maximum gauge w1, w2 of about 50 μm. As shown in FIG. 5b, the collector 120 has been equipped with a micro-structured surface portion 124, facing the emitter 110, by micro-blasting, where the surface is bombarded with sharp, micrometer-sized particles so as to increase the area of the surface.

Figure 5C:
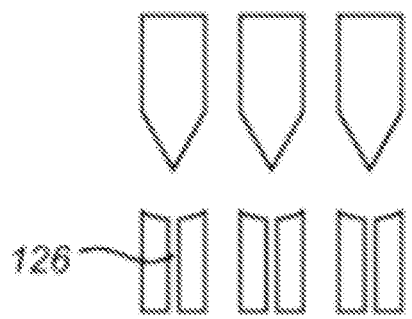
Figure 5D:
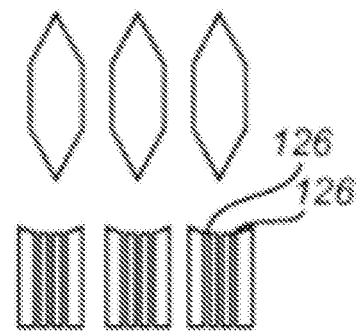

The flow units 100 in FIGS. 5b-5d are similar to the flow unit 100 described with reference to FIG. 5a. According to FIG. 5b, the emitter 110 is further provided with a tapered upstream portion 117, forming a relatively sharp edge 118 directed towards the fluid flow so as to reduce the flow resistance and hence enhance the flow through the emitter 110. As indicated in FIGS. 5c and 5d, the collector 120 may further define channels 126 extending through the bridges and/or the joints (not shown) of the grid in order to decrease the flow resistance. The channels 126 may e.g., be affected by etching, such as e.g., reactive ion etching, wet etching, etc.

Figure 6A:
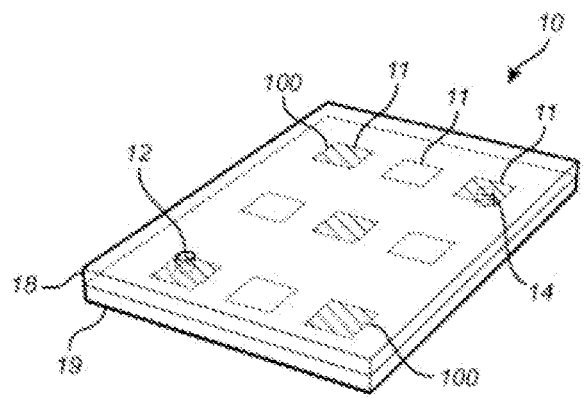
FIGS. 6a and 6b are schematic views of an array of flow units according to example embodiments.

FIG. 6a shows an array 10, or pump assembly, comprising a plurality of flow units 100. The flow units 100 may be arranged in a cell structure comprising a lid part 18 and a bottom part 19. In FIG. 6a, the outline of each cell 11 of the cell structure is indicated by a dashed line, whereas a cell 11 comprising a flow unit 100 is indicated by diagonal cross-hatching. The array 10 may comprise a first opening 12 for supply of fluid to the array 10. The first opening 12 may, e.g., be arranged in the lid part 18. Further, a second opening 11 for outputting the fluid may be arranged in the bottom part 19 (indicated by a dashed line). According to the example embodiment, the array 10 may comprise, e.g., five flow units 100 arranged in every second cell 11 of the cell structure. The flow units 100 may be arranged in a same direction or orientation such that the direction of flow of the fluid is essentially parallel for each one of the flow units 100. The cells 11 may be in fluid communication with one or several other cells 11 so as to allow a fluid to flow between the cells, preferably from one cell 11 to a neighboring cell 11. During operation, a fluid may enter the cell structure via the first opening 12 and pass through a first flow unit 100 to a second flow unit 100 via neighboring or intermediate cell 11, and eventually exit the cell structure through the second opening 14. Thus, the first opening 12 may be arranged, during operation, to receive fluid from an upstream side of the enclosed passage or loop, whereas the second opening 14 may be arranged to deliver fluid to a downstream side of the enclosed passage.

Figure 6B:
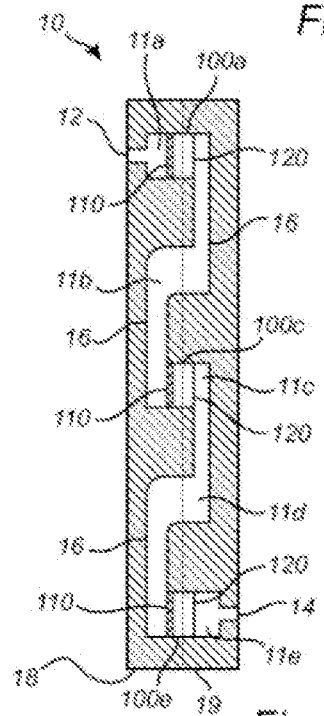

FIG. 6b is a cross sectional side view of an array 10 that is similarly configured as the array 10 of FIG. 6a. The array 10 of flow units 100a, 100c, 100e is arranged in cells 11a, 11c, 11e defined by a lid part 18 and a bottom part 19 comprising cell separating walls 17. The cells 11a, 11b, 11c, 11d, 11e are connected to each other by means of channels 16 adapted to let a flow of fluid pass from a downstream side of a flow unit 100a, via an empty cell 11b, to an upstream side of a neighboring flow unit 100c. Each flow unit 100a, 100c, 100e comprise a first electrode 110, such as, e.g., a grid shaped emitter, and a second electrode 120, such as, e.g., a metal plate provided with a through-hole.

During operation, fluid may be entered through a first opening 12 and brought in fluid contact with the first electrode 110 of the flow cell 100 arranged in cell 11a. The fluid may be brought to flow by means of an electric field induced between the first electrode 110 and the second electrode 120, and continue through the channel 16 and the neighboring, empty cell 11b to the next flow unit 100c. This process is repeated until the fluid reaches the second opening 14, through which it may exit the array 10.

As indicated in FIGS. 6a and 6b, the flow units 100 may be oriented in the same direction, allowing the fluid to pass through each flow unit 100 in the same flow direction. Such arrangement of the flow units 100 may require a channel 16 and, according to the present example, an intermediate empty cell 11b, 11d for "reversing" the flow exiting at the downstream side of a first flow unit 100 before it can enter at the upstream side of a second flow unit 100.

Figure 7A:
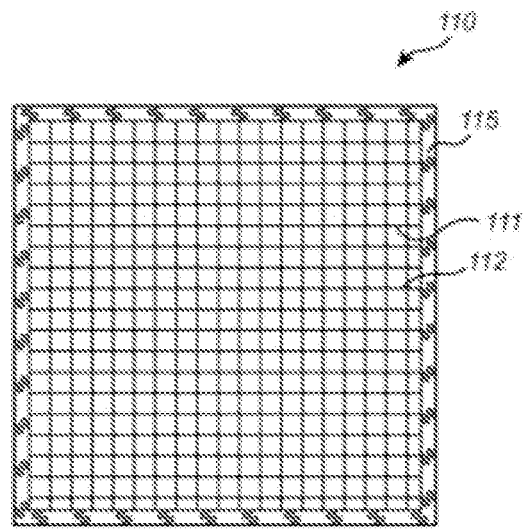
FIGS. 7a and 7b are top views of an electrode of a flow unit provided with a deformation structure according to example embodiments.

FIG. 7a shows a deformation structure 115 of a grid acting as, e.g., an emitter 110 in a flow unit 100 according to example embodiments. The grid comprises bridges 111 and joints 112 in accordance with the previously described example embodiments. As indicated in FIG. 7a, the deformation structure 115 is composed of bridges 111 that are curved in a plane normal to the flow direction. The curved shape may, e.g., be formed during manufacturing of the bridges 111, or induced by e.g., thermal stresses occurring during use of the flow unit 100. The curved shape may also comprise a weakened portion, e.g., a portion having a reduced gauge, so as to make it easier to deform upon heat induced stresses. As the material of the grid may expand with an increasing temperature, the bridges 111 of the deformation structure 126 may be compressed by compressive forces acting in the length direction of the bridges 111. By length direction should be understood the direction of extension between a first joint and a second joint. Thereby the lateral expansion of the grid may be absorbed by the deformation structure 115 and thermally induced stresses reduced so that the emitter 110 other than the deformation structure 115 may keep its original shape despite thermal expansion. It should however be understood that the forces acting on the bridges 111 of the deformation structure 115 also, or alternatively, may be caused by, e.g., a torsional moment, or torque, acting on the structure.

Figure 7B:
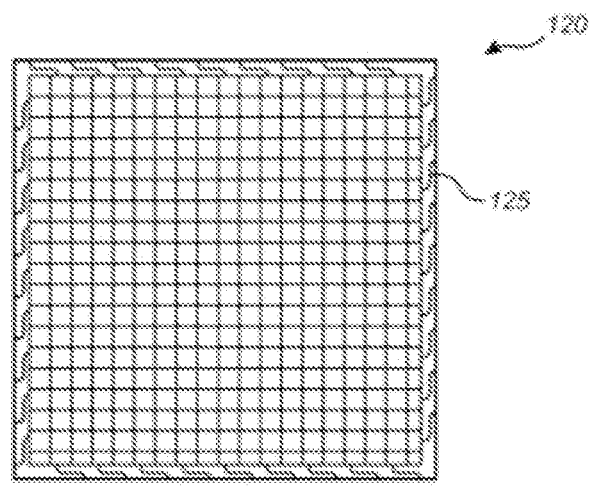

FIG. 7*b* shows a similar deformation structure 125 as described with reference to FIG. 7*a*, wherein the deformation structure 125 is formed of bridges 121 of a collector 120 of a flow unit 100 according to an example embodiment. It will however be understood that the flow unit 100 may be provided with deformation structures 115, 125 arranged in any one, or several, of the emitter 110, the collector 120, and the support structure 130.

The deformation structure 115, 125 may be provided in an emitter 110 and/or collector 120 that is attached to a support structure 130, where the support structure 130 may have a coefficient of thermal expansion (CTE) that differs from the CTE(s) of the emitter 110 and/or collector 120. In case the emitter 110 and/or collector 120 is/are rigidly attached to the support structure 130, the risk for deformations, such as, e.g., bending and flexures, and damages such as fractures, disconnected or loosening joints, etc. may be reduced by the deformation structure 115, 125 to increase the reliability and useful life of the flow unit 100.

Figure 8:
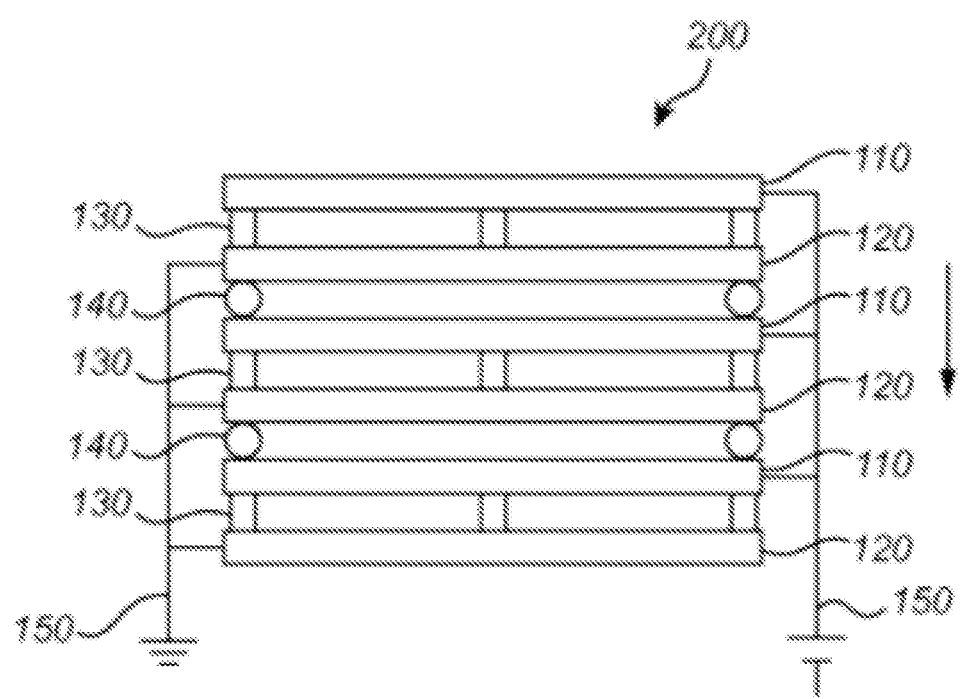
FIG. 8 is a cross section of a flow unit according to an example embodiment, comprising a stack of a plurality of electrodes.

FIG. 8 shows a cross section of flow unit 200 comprising a stacked structure of three first electrodes 110 and three second electrodes 120 according to any one of the previously described example embodiments. The cross section is taken along the direction of the flow (indicated by an arrow in FIG. 8) and across a respective bridge 111, 121 of the grids of the electrodes 110, 120. A voltage source 150 is connected across the three first electrodes 110 and the three second electrodes 120. A grid spacer 130 is arranged to separate the emitter 110 and the collector 120 electrodes from each other in the direction of the flow. According to this example embodiment, the emitters 110 and collectors 120 may comprise e.g., Pt, Au, or stainless steel forming, e.g., the bulk material or a surface coating.

The grid spacer 130 may, e.g., be formed as a grid supporting the emitters 110 and the collectors 120. As illustrated in FIG. 8, the grid spacer 130 may comprise a peripheral frame of bridges to which the edge portions of the emitter 110 and the collector 120 are attached by, e.g., welding, soldering or gluing. Alternatively, or additionally, the grid spacer 130 may comprise other spacing structures such as pillars or spacers, etc. The grid spacer 130 may also comprise one or several spacing members, such as, e.g., additional bridges or pillars, supporting the center portions of the emitter and collector. The grid spacer 130 may also comprise a deformation structure 115, 125 (not shown) similar to the deformation structure described with reference to FIGS. 7*a* and 7*b*.

The spacing d of the emitter and collector may be determined by the height of the bridges of the grid spacer 130, which may hence determine the magnitude of the electric field induced between the emitter 110 and the collector 120. The distanced between the emitter 110 and the collector 120 may, e.g., be within the range of 10 μm and 1000 μm.

Further, the grid spacer 130 may comprise an alignment structure for facilitating alignment of the emitters 110 and the collectors 120, and/or alignment of the flow units 100 in the array.

The invention is not limited to the disclosed example embodiments, but on the contrary, covers various modifications and equivalent arrangements included within the spirit and scope of the appended claims.

The invention claimed is:

1. A thermal control system including an electrohydrodynamical (EHD) pumping device, comprising:
a closed loop arranged to carry a circulating dielectric fluid;
at least a first heat exchanger in the closed loop; and
a flow unit in the closed loop comprising:
a first electrode; and
a second electrode offset from the first electrode in a downstream direction of a flow of the circulating dielectric fluid, the first electrode and the second electrode being connectable to a voltage source and configured to provide an electric field to ionize particles or molecules and control a flow of the circulating dielectric fluid;
wherein the first electrode is formed as a grid structure and arranged to allow the circulating dielectric fluid to flow through the first electrode, and
wherein the first heat exchanger is separate from the grid structure.

2. The thermal control system according to claim 1, wherein the first heat exchanger includes a heat sink to enable heat dissipation from the circulating dielectric fluid in the closed loop.

3. The thermal control system according to claim 2, wherein the heat sink includes flanges to improve thermal exchange via the heat sink.

4. The thermal control system according to claim 1, wherein at least a second heat exchanger is provided in the closed loop.

5. The thermal control system according to claim 4, wherein the second heat exchanger is a heat source.

6. The thermal control system according to claim 1, wherein the first heat exchanger is provided in conjunction with another structure.

7. The thermal control system according to claim 6, wherein the first heat exchanger is provided in contact with a housing of the another structure.

8. The thermal control system according to claim 6, wherein the first heat exchanger forms a part of a housing of the another structure.

9. The thermal control system according to claim 1, further comprising:
a plurality of closed loops arranged to carry the circulating fluid,
wherein each of the plurality of closed loops includes a flow unit.

10. The thermal control system according to claim 1, further comprising:
a third electrode.

11. The thermal control system according to claim 10, further comprising:

a plurality of flow units in the closed loop.

12. The thermal control system according to claim 1, wherein the first heat exchanger is locatable in a different location in the closed loop spaced apart from where the grid structure is located in the closed loop.

13. The thermal control system according to claim 1, wherein one or more other types of heat exchangers of a different type than the first heat exchanger are provided in the closed loop.

* * * * *